United States Patent [19]

Mathewson

[11] 4,035,783
[45] July 12, 1977

[54] ANALOG DELAY CIRCUIT

[76] Inventor: Clifford Earl Mathewson, 18624 Vintage, Northridge, Calif. 91324

[21] Appl. No.: 631,079

[22] Filed: Nov. 12, 1975

[51] Int. Cl.² .......................................... G11C 13/00
[52] U.S. Cl. ...................... 340/173 R; 179/15.55 T
[58] Field of Search ................. 179/15.55, 15.55 T; 340/173 R

[56] References Cited

U.S. PATENT DOCUMENTS 3,816,664   6/1974   Koch ........................... 179/15.55 T

OTHER PUBLICATIONS

Analog–Digital Conversion Handbook by Engineering Staff of Analog Devices, Inc., Norwood, Mass., June 1972, pp. 1-84 thru 1-90.

Primary Examiner—Terrell W. Fears
Attorney, Agent, or Firm—Kleinberg, Morganstern, Scholnick & Mann

[57] ABSTRACT

Solid state digital circuitry is used in an apparatus which receives standard, continuously variable 4 to 20 milliampere analog signal information, continuously stores this information in a digital format and, after a preselected time interval measured in minutes, reproduces this information in its original smooth analog form with a fidelity of ± ½%.

5 Claims, 4 Drawing Figures

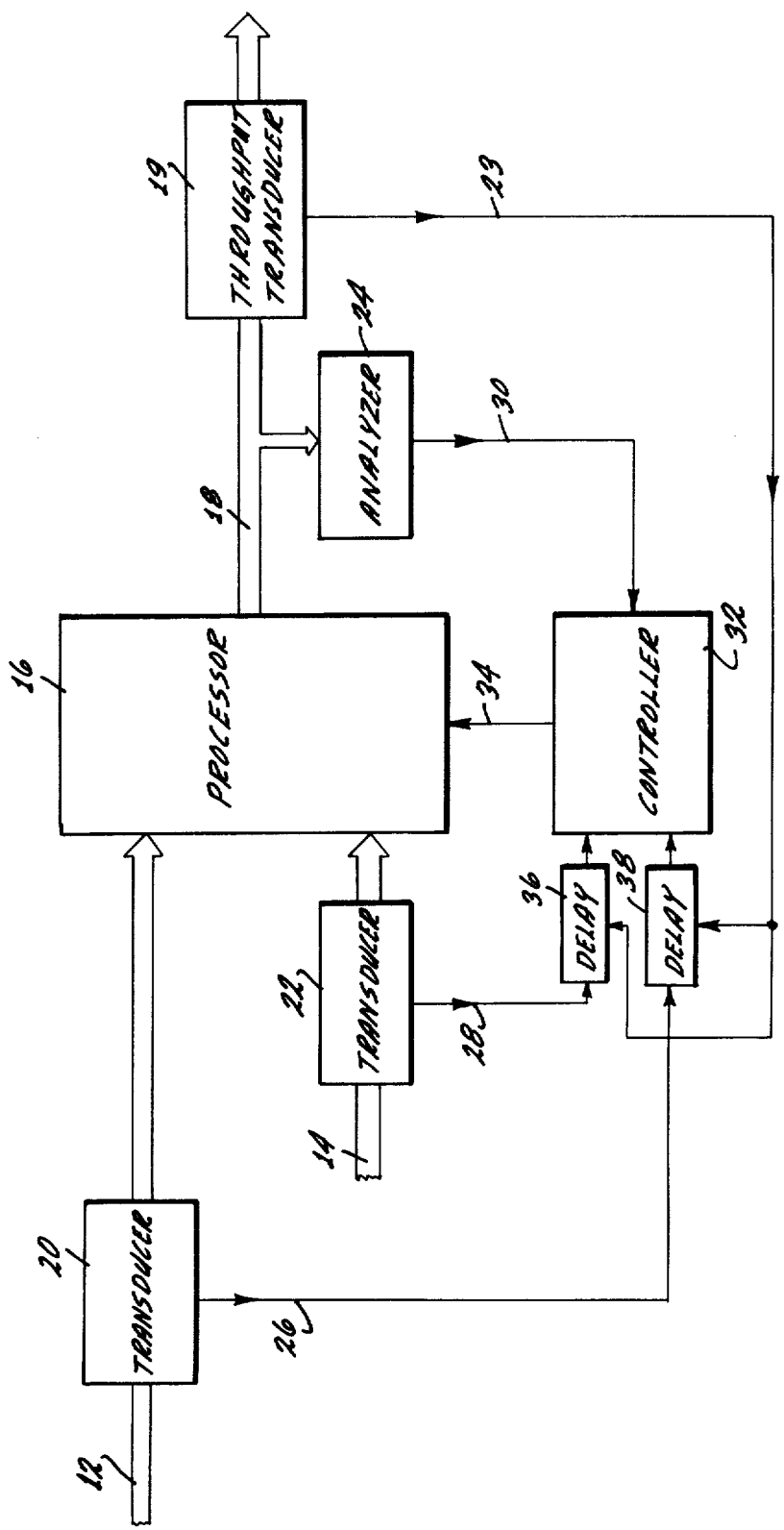

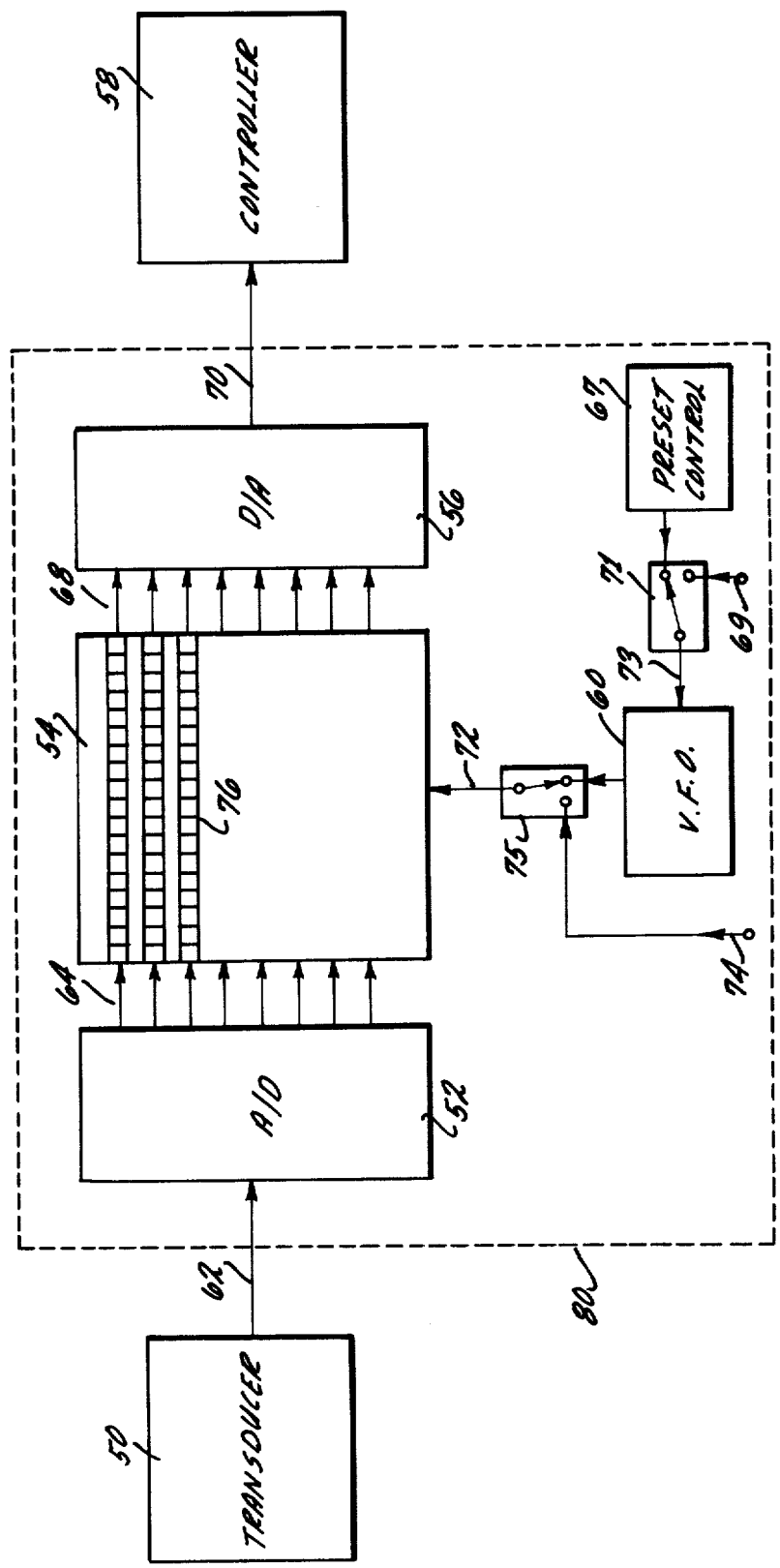

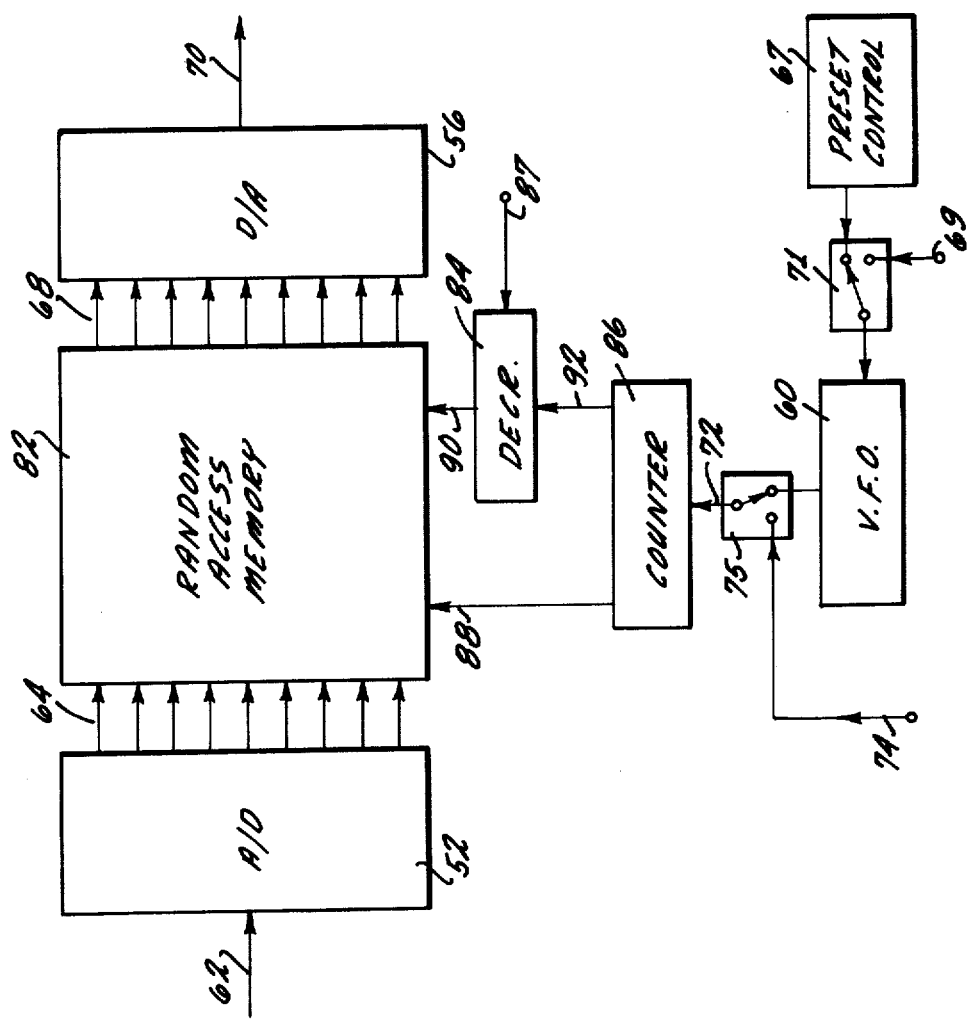

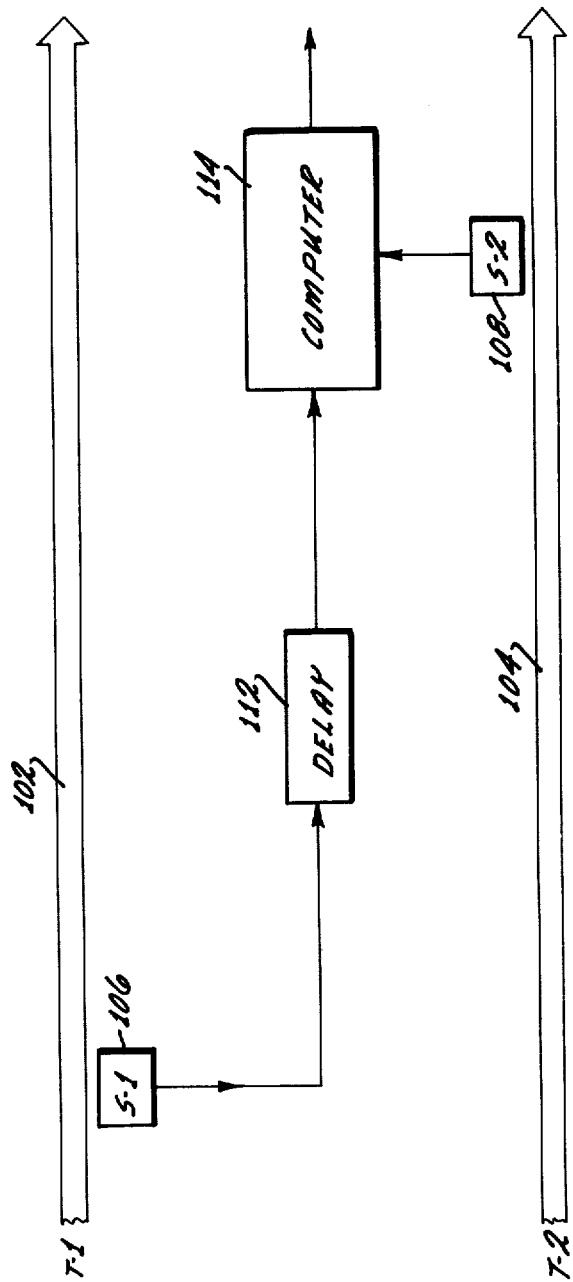

ANALOG DELAY CIRCUIT

BACKGROUND OF THE INVENTION

1. Field of the Invention

The present invention is in the field of delay devices and more particularly, applies to circuitry for the generation of pure time delay or dead-time in the path of dynamic analog electrical signal information, for use in multi-variable and feed forward process control systems.

The majority of modern process control instruments communicate with one another via a standard d.c. current signal that ranges from 4 to 20 milliamperes which relates to the magnitude or parameter of a process variable being measured, or magnitude of a control signal. Since these current signals are dynamic or continuously variable, their levels may be referred to as amplitudes.

Transducers measure process variables or parameters such as flow rate, pressure, temperature, weight and chemical composition. Controllers receive this process information as a continuous dynamic analog signal and compute corrective control responses which are transmitted to actuators which are usually power actuated control valves.

Simple control systems such as flow, where the flow rate transducer and the flow control valve are located in proximity, operate in the same time frame since no lags or dead-times are involved and no time related problems exist. More complex control systems often exhibit severe time related problems.

The degree of process control that is achievable, or how close a process variable or parameter may be held to an optimum condition, is directly dependent upon a control system's capability to provide corrective actions that are as close to being 180° out of phase with variations from optimum-set-point, as is possible. The achievement of this 180°, which permits an open loop control gain of unity, is normally not possible. This necessitates the reduction of loop gain, or control effectiveness, in proportion to the amount of inherent phase lag, in order to prevent instability and cycling. This is commonly referred to as sloppy control. Dead-time, which constitutes a pure time delay between a stimulus and its response, constitutes the major problem in these systems. Many of these problems may be resolved by this present invention.

Examples of applications include the necessity of measuring a variable at a point in transit which precedes its arrival at the control position, such as found in blending operations where solids travelling on a conveyor belt must normally be weighed on the belt before the material reaches the blending station. To properly control the blend ratios, the weight of the solids must be continuously stored in memory and recalled as the material reaches the blending point.

A more complex example of application is where chromatographs are used to analyze the chemical composition of a product produced by one or more process units which are charged upstream by blending two or more different crude streams. The chromatograph analyzer may sample at intervals of one minute because one minute is required to complete analysis. Process units exhibit residence time that is related to delays in transport and reaction of material. If the charge blending ratios are to be corrected on the basis of product analysis, it is necessary to be able to recall what the blend ratios were prior to residence and analysis dead-time, because other control inputs may be continuously varying these blend ratios on the basis of another process parameter.

A further problem in dealing with dead-time is that both mechanical and fluid process systems commonly operate at varying throughput rates, which in turn, vary the dead-time involved. The present invention also solves this problem since it may receive a secondary input signal for the control of its internal time delay function.

A different field of application from that of control, lies in the need to store and recall at some later time, discreet signal information relating to some value or magnitude of a continuing series of individual measurements. Such an application could be the weighing of individual containers on a conveyor belt and the need to hold this information in memory until such time as each container is delivered off the belt. The present invention resolves this problem through its ability to synchronize its delay period by means of item count, in addition to time delay.

2. The Prior Art

A process control application is described in U.S. Pat. No. 3,764,789 to Nara. The instrumentation used by Nara makes use of "analog shift registers", each having a plurality of analog storage elements connected in series. Nara does not describe the structure of his "analog shift register" because his patent relates to the entire automatic control system rather than its components.

In U.S. Pat. No. 3,675,049, Haven shows a device for delaying the bits of a serial digital data stream. Haven's innovation is the use of counters as delay stages, thereby causing the number of counter stages to increase as the base 2 logarithm of the maximum delay produced. Haven makes use of a distributor which supplies the bits of the data stream to the input of each counter-delay channel in turn. The distributor is arranged to advance to the next channel only after the occurence in the data stream of a 1. Data bits of 0 do not cause the distributor to advance. Due to the action of the bit distributor in selecting only 1's from the data stream for delay, fewer delay channels are needed than the total delay introduced. Thus, the invention of Haven is limited to use with a single stream of digital 1's and 0's.

In U.S. Pat. No. 3,799,871, Sequeira describes a sample and hold circuit in which an incoming analog signal is converted to digital form and stored in a single stage storage register. Upon receipt of a read-out signal, the digital data stored in the storage register is read out and converted to analog form. It is clear that in this invention, only one sample of information can be in storage at any one time, and thus, the maximum delay possible must be less than the sampling period of the data.

In U.S Pat. No. 3,532,907, Kasper shows a circuit for delaying a signal of predetermined characteristics based on the analog technique of issuing a signal when a current accumulated by a capacitor exceeds a predetermined value. Shift registers are not used.

The analog signal delaying devices presently known in the art, which make use of delay lines or capacitor arrays for signal storage, are expensive, bulky and maintenance prone. Electro-mechanical problems limit reliability, and decay and charging characteristics of the capacitor, place restraints on accuracy or reproduction of input amplitudes. Likewise, long time delays sometimes needed are impractical.

Because of these problems, the instrument control industry has adopted electronic dead-time simulation techniques for use wherever possible. While these provide the advantages of low cost, high reliability and small size, they produce only predictive approximations which limit the achievement of the theoretical process control performance available with true dead-time. The evidence appears to indicate an important and long felt need for a signal delaying device which will delay an analog signal by a precise adjustable time displacement and which will subsequently reproduce the signal with a high degree of fidelity and reliability, through the use of state-of-the-art electronic circuitry. Further, that its industrial implications in the improvement of process efficiencies and productivities are significant to the degree of a major instrumentation breakthrough.

SUMMARY OF THE INVENTION

The present invention employs analog plus digital circuit techniques to delay an analog signal by a preselected or controlable amount of time. Specifically, the present invention receives, as its input, a continuous analog signal ranging between 4 and 20 milliamperes, which is the standard type of signal used in perhaps 65% of all modern process control applications. After a preselected time delay the invention presents an output signal to an amplitude fidelity of ±½%. Time delays in the order of many minutes can be achieved with the unit, and the delay time can be accurately controlled. The invention features CMOS and PMOS logic for high noise immunity. The inputs and outputs are optically isolated from each other and from the power supply preventing all ground loop problems when inserting the device between other process control instruments.

These features are achieved in the present invention by converting the incoming analog signal to a non-deteriorating digital format, specifically an eight bit binary code. These binary bits that represent an instantaneous sample of the incoming data are applied in parallel to a series of stepping registers. These registers are stepped in unison by application of a stepping pulse. The stepping pulses may be supplied by an internal oscillator operated either as a clock or regulated by an externally generated signal. Alternatively, the stepping pulses may be independently supplied from an external source.

When the binary coded signal has been stepped to the end of the shift registers, it is converted back to analog form and presented as the output of the system of the invention. The number of stages in the parallel shift registers should equal the number of data samples needed to smoothly reconstruct the dynamics of the originally entered analog variable over a time interval equal to the delay time. In one embodiment, eight shift registers, each having 128 stages, are used in parallel, permitting up to 128 samples to be held in storage at any time.

A specific feature of the preferred embodiment is that integrating or smoothing action is applied at the input for transient noise reduction, and at the output for eliminating step changes in amplitude.

The novel features which are believed to be characteristic of the invention, both as to organization and method of operation, together with further objects and advantages thereof, will be better understood from the following description considered in connection with the accompanying drawings in which several preferred embodiments of the invention are illustrated by way of example. It is to be expressly understood, however, that the drawings are for the purpose of illustration and description only and are not intended as a definition of the limits of the invention.

BRIEF DESCRIPTION OF THE DRAWINGS

FIG. 1 is a schematic flow diagram showing the application of the present invention to a typical process control system; and FIG. 2 is a block diagram showing the structure of a preferred embodiment of the present invention.

FIG. 3 is a block diagram showing an alternative embodiment of the present invention; and FIG. 4 ia a schematic diagram showing the application of the present invention as a correlator.

DESCRIPTION OF THE PREFERRED EMBODIMENT

Turning now to the drawings, in FIG. 1 there is shown a typical process control system of the type in which the present invention could find application. In this example, a processor 16 receives stream 12 and 14 of ingredients and blends them in a desired manner to produce the output stream of material 18. Transducers 20 and 22 are measuring some property of the incoming streams of material 12 and 14, respectively. Transducers 20 and 22 may, for example, be flow meters measuring the volumetric flow rates in each of the streams 12 and 14, respectively. Analyzer 24 may, for example, be a chromatograph for analyzing the composition of output stream 18. Transducer 19 measures the throughput of the processor and transmits it on conductor 23 to delay units 36 and 38 for adjusting their delay times to reflect variations in the speed with which material is flowing through processor 16.

It can be appreciated that there are several delays inherent in the system of FIG. 1. One such delay is the transport delay which represents the time required for the material sensed by transducers 20 and 22 to reach the processor 16. A second type of delay is the analysis time required by analyzer 24 to process the sampled material and generate an output signal. In practical situations, each of these types of delay is present to some extent and the control system must take them into account.

In the control system of FIG. 1, the transducers 20 and 22 typically produce on output lies 26 and 28, respectively, analog signals representing some physical property of the input material streams. Likewise, analyzer 24 generates on conductor 30 an analog signal representing some property of the output stream of material. The signals on conductors 26, 28 and 30 are combined in controller 32 to produce a control signal on conductor 34 for controlling the operation of processor 16. In one type of control system, the transport delays are compensated by delay units 36 and 38 which make possible a comparison in controller 32 of the signals on conductors 26, 28 and 30 on a comparable time basis. If delay units 36 and 38 were not available, the controller 32 would be forced to compare variables measured at different times. The present invention relates to the structure of delay units such as 36 and 38.

In a large portion of existing process control systems, transducers such as 20 and 22 generate output signals in a standard analog format, continuously variable from 4 to 20 milliamperes, and most controllers such as 32 of FIG. 1, are adapted to receive input data in that standard format.

It is clear that delay units for process control must do more than produce a delayed response when stimulated by an input signal. Such a delayed response would be obtained if the delay unit consisted of a simple RC network. But such simple networks have the additional undesirable property of distorting the signal passed through them. For process control work, it is necessary that the delay unit, such as 36 and 38 of FIG. 1, after introducing a suitable time delay must reproduce with high fidelity the original input signal. Further, the time delay achievable with capacitor networks of practical construction are quite short because of decay and loss problems, whereas the time delays inherent in process control work frequently may be measured in minutes, if not hours.

FIG. 2 is a block diagram showing the interconnection of the components of the analog delay circuit of the present invention. Those components comprising the present invention are enclosed within the dashed block 80.

A remote transducer 50, not a part of the present invention, typically generates an input signal to the delay circuit on a conductor 62. That input signal typically has the standard format already described. The analog signal on conductor 62 is continuously fed to the analog-to-digital converter 52 which in a preferred embodiment converts the analog signal to an 8 bit binary coded decimal format. Thus, at any instant the output of analog-to-digital (A-D) converter 52 in the preferred embodiment is a set of signals on the eight lines of 64. The signals on these lines represent either a 1 or a 0, consistent with the binary code equivalent to, and representative of the analog signal.

Each of the conductors 64 on which the output of A to D converter 52 is presented is fed to its own shift register in shift register assembly 54. All of the binary bits representing an instantaneous value of the analog signal 62 are input to the shift register assembly 54 at the same instant, and thus, these bits occupy the first column of the assembly, which column consists of the first stage of the total number of parallel shift registers 76.

All of the parallel shift registers 76 in assembly 54 are shifted simultaneously in response to each pulse on conductor 72 to thereby shift the entire column of bits one step to the right, after which the bits occupy the successive stages of each of the shift registers 76. Successive pulses on conductor 72 step the column of bits through successive stages in the shift register assembly 54. Upon reaching the last stage, the column of bits is transferred upon receipt of the next shift pulse on conductor 72, to the digital-to-analog converter 56 by way of eight conductors 68. Digital-to-analog converter 56 generates a current of the standard form in response to the set of eight bits representing the instantaneous value of an original input analog signal. This generated signal in the form of a current conductor 70 is the output of the analog delay circuit of the present invention and may be used by controller 58 for control purposes.

In the preferred embodiment of FIG. 2, the shifting pulses input to shift register assembly 54 on conductor 72 may alternatively be generated by variable frequency oscillator 60 or may be independently generated externally and input through terminal 74 and switch 75. In the preferred embodiment, the pulse repetition rate is controlled by the control signal input to VFO 60 on conductor 73. This control signal may alternatively be a constant analog signal provided by a manually adjustable preset control 67 or may be an externally generated analog signal applied through terminal 69 and switch 71. In the latter case, this becomes a secondary input signal for controlling the delay time period. Switches 75 and 71 can be manually set.

In an alternative embodiment, the shift registers 76 may be constructed with any number of stages. The total length of the shift register determines how many shift pulses must be input on conductor 72 to transport an initial instantaneous reading of the variable from one end of the shift register 76 to its other end. Thus, the length of the register is related to the number of samples or shift commands that are needed to accurately trace the variations of the input signal over the total delay period required.

If only a single instantaneous sample need be taken at some specific time, it is possible to count related events or accumulate the time by external or internal means and generate only a single shift pulse when the desired number of events or the desired time interval has elapsed. In such a case, registers having only two stages could be used in the assembly 54.

In most applications, however, the situation is not so simple as just described. The technique just described will result in the storage of a single instantaneous value of the input for a predetermined time, but will not permit the accurate reconstruction of the entire time history of the input signal in dynamic form. To reproduce the input signal with a high degree of amplitude fidelity may require a relatively rapid sampling rate or many samples over the delay period. Depending on the application, it will frequently be found that adequate fidelity can be obtained only if the sampling rate is relatively rapid. In such a case, it will be necessary that numerous instantaneous sampled values of the input signal be stored in the shift register assembly 54, and it is for this reason that the individual shift registers should comprise many stages. Thus, if the input signal fluctuates rapidly during the delay time and if it is necessary to reproduce the input signal with high fidelity, it will be necessary to have a large number of stages in each of the shift registers. In the preferred embodiment, 128 stages are provided.

In yet other embodiments, the input signal may be converted to digital form using any number of different codes. For example, analog-to-digital converter 52 may convert the incoming signal to a BCD or binary coded decimal format rather than the eight bits corresponding to a straight binary code as used in the preferred embodiment. Further, bits may be added to increase resolution.

In still another embodiment, shift register assembly 54 could be replaced by any adequate storage medium such as a random access memory with the address of the storage location being generated for example by a counter operated by the pulses on conductor 72.

Such an embodiment is shown in FIG. 3 in which the pulses on conductor 72 are fed into recycling counter 86. The count of counter 86 is fed to random access memory 82 on bus 88 for use as an address for the then-arriving data. The count of counter 86 also is fed via bus 92 to decrementing unit 84, which decreases the count by a predetermined number input at terminal 87, for use as the address from which the data then to be read out is located. Other embodiments are within the scope of the present invention. For example, the pulses on conductor 72 could be fed to two separate counters, one of which is provided with an initial count different from that of the other counter.

The address generating apparatus, such as the counter 86 and decrementing unit 87 or the two counters in the other embodiment, along with the random access memory are regarded as collectively making up the digital memory means of the delay generator.

The delay generator of the present invention is readily usable in applications where correlation analysis is to be performed. In those operations, the value obtained by a first variable at some particular time is mathematically combined with the value obtained by a second variable at a later time.

FIG. 4 illustrates a typical situation in which correlation analysis might be used. T-1 and T-2 represent two tracks of magnetic recording 102 and 104, respectively. These tracks might, for example, be records of seismic soundings made in oil exploration experiments. S-1 106, and S-2 108, are reading heads for sensing the magnetic fluctuations and converting them to analog electrical signals. The signal from S-1 recording head 106 is delayed in delay circuit 112 before being fed to computer 14 for comparison with the output of S-2 recording head 108.

If the delay circuit of the present invention is used as delay circuit 112, it is possible by repeated replaying of the recordings, to determine the degree of correlation between them for various amounts of time delay.

In this way, the amount of delay that produces the best correlation between the two tracks of magnetic recording can be determined.

The use of digital storage in the present invention rather than analog storage represents a significant breakthrough in that the recent improvements in cost and size that have been made in digital solid state chip technology can be utilized in novel circuitry for use in an anlog environment. As a result, the preferred embodiment permits the input signal to be reproduced with a fidelity of ±½% or better over any delay period required, which normally ranges between 4 and 480 seconds. As pointed out above, the analog-to-digital and digital-to-analog converters have been designed so as to render the system of the preferred embodiment fully compatible with the analog signal format most frequently used in process control work.

A further benefit derived from the use of digital circuit techniques in the preferred embodiment is that optical isolation stages have been included in each of the output lines of analog-to-digital converter 52 of FIG. 2. Further, in the preferred embodiment, a separate power supply is provided for the analog-to-digital converter 52, thereby eliminating any possibility of coupling through a common power source. The result is complete isolation of the input and output circuits of the delay device.

The preferred embodiment further includes provisions for setting or calibrating the delay time to be utilized. An input of zero magnitude is applied to the delay device by push button and the output is then monitored by means of a panel light which will flash when zero magnitude arrives at the output. Alternatively, an additional single bit shift register may be used with the same number of steps as the memory, which is shifted by the master shift pulse. By inserting and detecting a logic 1, a similar indication is provided.

Thus, there has been described an analog delay circuit which takes full advantage of recent advances in digital chip technology to achieve a pure time delay of an analog signal in an apparatus which is more accurate, smaller, more reliable, more adaptable for use with current signals, capable of infinitely greater delay times, capable of external control of delay period, and less expensive then equivalent delay circuits operating in an analog mode.

The foregoing detailed description is illustrative of one embodiment of the invention, and it is to be understood that additional embodiments thereof will be obvious to those skilled in the art. The embodiments described herein together with those additional embodiments are considered to be within the scope of the invention.

What is claimed is:

1. An apparatus for automatically comparing time varied characteristics in a dynamic system, comprising in combination:

at least one first transducer means for sensing a first characteristic of the system at a first point in time, and for producing an analog electrical signal corresponding to the first characteristic;

digital delay circuit means for receiving the analog signal, for holding the signal for a preselected time period and for producing a true, relative to the received analog signal, output analog signal, said delay circuit means including at least an analog-to-digital real time signal converter, digital signal memory storage having an externally responsive information release, a variable frequency oscillator for generating stepping signals, delay interval selecting means for controlling the variable frequency oscillator, and a digital-to-analog real time signal converter;

second transducer means for sensing a second characteristic of the system at a second point in time not coincidental with the first point, and for producing an analog electrical signal corresponding to the second characteristic;

comparator means for receiving the delay circuit means output analog signal and the second transducer means analog signal, for comparing the two signals and producing an electrical control signal responsive to the comparison; and means responsive to the electrical control signal for manipulating functions of the dynamic system.

2. The apparatus of claim 1 further comprising a plurality of said first transducer means, and wherein said comparator means receives the analog electrical signal output of each of said first transducer means and compares the said signals with the said second transducer means analog signal and produces an electrical control signal responsive to the comparison.

3. The apparatus of claim 1 further comprising a combination:

first electrical power supply means for providing electrical energy to said analog-to-digital real time signal converter; and second electrical power supply means for providing electrical energy to the storage, oscillator and digital-to-analog real time signal converter.

4. The apparatus of claim 1 wherein the delay interval selecting means includes a switch for preselecting an input to the variable frequency oscillator, and wherein at least one of said inputs preselectable by said switch includes an externally generated analog signal, and wherein at least another of said preselectable inputs to said variable frequency oscillator includes a constant analog signal generated by a manually adjustable preset control means for providing the said constant analog signal.

5. In an apparatus for automatically comparing time varied characteristics in a dynamic system, the combination comprising:

input means adapted to connect to at least one first transducer means for sensing a first characteristic of the system at a first point in time, and for producing a first analog electrical signal corresponding to the first characteristic;

digital delay circuit means for receiving the analog signal, for holding the signal for a preselected time period and for producing a true, relative to the received analog signal, output analog signal, said delay circuit means including at least an analog-to-digital real time signal converter, digital signal memory storage having an externally responsive information release, a variable frequency oscillator for generating stepping signals, delay interval selecting means for controlling the variable frequency oscillator, and a digital-to-analog real time signal converter; and output terminal means coupled to said digital-to-analog real time signal converter for supplying a second analog signal substantially identical to said first analog signal at a later time corresponding to the selected delay interval.

* * * * *